United States Patent
Cheng et al.

(10) Patent No.: US 6,261,891 B1
(45) Date of Patent: Jul. 17, 2001

(54) METHOD OF FORMING A PASSIVATION LAYER OF A DRAM

(75) Inventors: Tzu-Min Cheng, Hsin-Chu; Chin-Hui Lee, Taipei, both of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/492,669

(22) Filed: Jan. 28, 2000

(51) Int. Cl.$^7$ .................. H01L 21/8234; H01L 21/8244
(52) U.S. Cl. ............................ 438/238; 438/396
(58) Field of Search ...................... 438/238, 240, 438/254, 255, 396, 398, 155, 207, 239, 253; 437/52, 60, 919

(56) References Cited

U.S. PATENT DOCUMENTS

| | | | |
|---|---|---|---|
| 5,547,893 | * | 8/1996 | Sung ..................................... 438/207 |
| 5,567,640 | * | 10/1996 | Tseng ..................................... 437/52 |
| 5,786,250 | * | 7/1998 | Wu et al. .............................. 438/254 |

* cited by examiner

Primary Examiner—David Nelms
Assistant Examiner—Phuc T. Dang
(74) Attorney, Agent, or Firm—Winston Hsu

(57) ABSTRACT

The present invention provides a method of forming a passivation layer of a DRAM on a semiconductor wafer. The semiconductor wafer comprises a silicon substrate, and two adjacent gates positioned on the surface of the silicon substrate wherein each gate comprises a spacer on each of two opposite walls. The method comprises forming a first silicon-oxygen-nitride layer of predetermined thickness on the semiconductor wafer, forming a second silicon-oxygen-nitride layer of predetermined thickness on the first silicon-oxygen-nitride layer and forming a BPSG (borophosphosilicate glass) layer uniformly on the second silicon-oxygen-nitride to planarize the surface of the semiconductor wafer. The BPSG layer is used as a dielectric layer. The first silicon-oxygen-nitride layer serves as diffusion barrier layer to prevent diffusion of boron and phosphorous from the BPSG layer into the silicon substrate. The second silicon-oxygen-nitride layer is used as an etching stop layer. The first and the second silicon-oxygen-nitride layers together constitute the passivation layer of the DRAM. The extinction coefficient of the first layer is smaller than that of the second layer, and the extinction coefficient of the first and the second layers is between 0.3 and 0.8.

8 Claims, 5 Drawing Sheets

METHOD OF FORMING A PASSIVATION LAYER OF A DRAM

FIELD OF THE INVENTION

The present invention relates to a method of forming a passivation layer of a DRAM (dynamic random access memory) on a semiconductor wafer, and more particularly, to a method of forming a silicon-oxygen-nitride passivation layer of a DRAM on a semiconductor wafer.

DESCRIPTION OF THE PRIOR ART

A self-aligned contact (SAC) etching process is a widely used technique in the field of DRAM fabrication on a semiconductor wafer. The formation of a contact hole, subsequently filled with doped polysilicon, is used as a node contact to electrically connect, for example, memory cells and bit lines of the DRAM. The SAC etching process possesses more alignment tolerance so as to ensure the reliability of the node contact. There is an excellent etching selectivity between silicon nitride and borophosphoslicate glass (BPSG), meaning that the SAC etching process can remove the BPSG faster than the silicon nitride layer. The silicon nitride layer is used as a stop layer for the SAC etching process.

Please refer to FIG. 1 to FIG. 5. FIG. 1 to FIG. 5 are cross-sectional diagrams of forming a contact hole 23, using a prior art SAC etching process on a semiconductor wafer 10. The semiconductor wafer 10 comprises a silicon substrate 12, and two adjacent gates 13 positioned on the surface of the silicon substrate 12. Each of the gates 13 comprises a silicon oxide layer 14, a polysilicon layer 15 and a silicide layer 16. Each gate 13 further comprises a silicon nitride spacer 18 on each of two opposite walls, and a silicon nitride passivation layer 17 on the top surface of the gate 13.

Before the SAC etching process is performed, a low pressure chemical vapor deposition (LPCVD) process is performed to form a silicon nitride layer 19 on the surface of the silicon substrate 12 and the gate 13. The silicon nitride layer 19 is used as an etching stop layer. Another LPCVD process is performed to deposit a BPSG layer 20 that serves as a dielectric layer on the surface of the silicon nitride layer 19, as shown in FIG. 2. A photoresist layer 21 is formed on the BPSG layer 20 and then a lithographic and an etching process are performed to form an opening 22 in the photoresist layer 21 for patterning the contact hole, as shown in FIG. 3. A SAC etching process is performed to remove the BPSG layer 20 under the opening 22 down to the surface of the silicon nitride layer 19. The photoresist layer 21 and the silicon nitride layer 19 are used as etching masks, as shown in FIG. 4. The selectivity of the etching process is then changed to remove the silicon nitride layer 19 under the opening 22 down to the surface of the silicon substrate 12. The photoresist layer 21 is then removed to complete the contact hole 23, as shown in FIG. 5.

Because there is an excellent etching selectivity between the silicon nitride layer 19 and the BPSG layer 20, the silicon nitride layer 19 is generally used as an etching stop layer for the SAC etching process. Furthermore, the silicon nitride layer 19 prevents diffusion of boron and phosphorous from the BPSG layer 20 into the gate 13 and the silicon substrate 12. Consequently, the silicon nitride layer 19 is widely used as a diffusion barrier layer in the field of semiconductor wafer fabrication. A tensile stress, however, is generated at the interface between the silicon substrate 12 and the silicon nitride layer 19 after the deposition of the silicon nitride layer 19. This tensile stress causes cracks in the silicon nitride layer 19 and causes electrical discharge from the capacitor of the DRAM. These cracks are a diffusion path for boron and phosphorous from the BPSG layer 20 into the silicon substrate 12 and the gate 13. In order to overcome the electrical discharging of the capacitor, the refresh frequency of the capacitor must be increased to ensure the validity of the stored data in the DRAM.

After all of the devices on the semiconductor wafer 10 are completed, a hydrogen annealing process is performed on the semiconductor wafer 10 to erase dangling bonds at the interface between the silicon oxide layer 14 and the silicon substrate 12. But since the silicon nitride layer 19 possesses a low permeability to hydrogen, it is difficult for hydrogen to diffuse into the interface between the silicon oxide layer 14 and the silicon substrate 12. This reduces the efficiency of the hydrogen annealing process.

SUMMARY OF THE INVENTION

It is therefore a primary objective of the present invention to provide a method of forming a silicon-oxygen-nitride passivation layer of a DRAM on a semiconductor wafer.

In a preferred embodiment, the present invention provides a method of forming a passivation layer of a DRAM on a semiconductor wafer, the semiconductor wafer comprising a silicon substrate, and two adjacent gates positioned on the surface of the silicon substrate, each gate comprising a spacer on each of two opposite walls, the method comprising:

forming a first silicon-oxygen-nitride layer of predetermined thickness on the semiconductor wafer wherein the first silicon-oxygen-nitride layer is used as a diffusion barrier layer;

forming a second silicon-oxygen-nitride layer of predetermined thickness on the first silicon-oxygen-nitride layer wherein the second silicon-oxygen-nitride layer is used as an etching stop layer;

forming a BPSG layer uniformly on the second silicon-oxygen-nitride to planarize the surface of the semiconductor wafer wherein the BPSG layer is used as a dielectric layer;

wherein the first silicon-oxygen-nitride layer is used to prevent diffusion of boron and phosphorous from the BPSG layer into the silicon substrate, the first and the second silicon-oxygen-nitride layers together constitute the passivation layer of the DRAM, the extinction coefficient of the first layer is smaller than that of the second layer, and the extinction coefficient of the first and the second layers is between 0.3 and 0.8.

It is an advantage of the present invention that there is less tensile stress at the interface between the silicon substrate and the passivation layer formed of silicon-oxygen-nitride so that the formation of cracks can be avoided. The silicon-oxygen-nitride layer possesses a higher permeability to hydrogen so that the efficiency of the hydrogen annealing process is enhanced, and the LPCVD process performed at a high temperature is replaced by a PECVD process performed at lower temperature so that the thermal budget is reduced.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
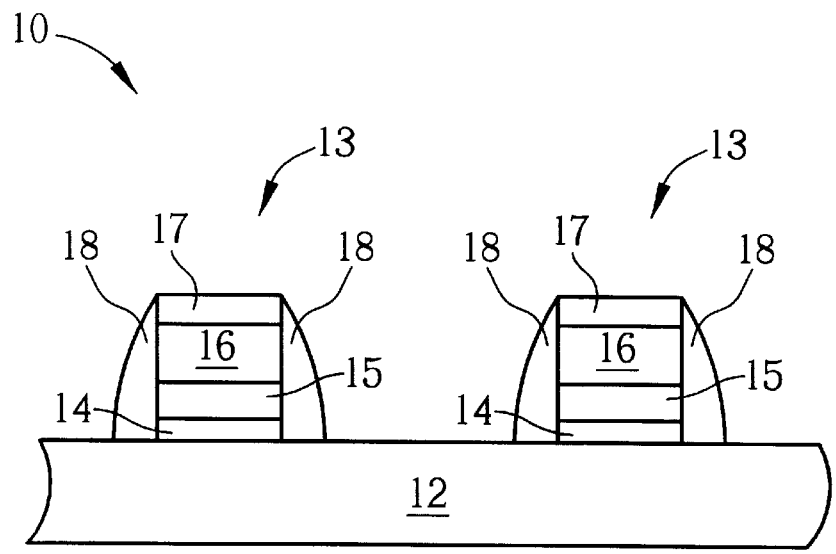
FIG. 1 to FIG. 5 are cross-sectional diagrams of forming a contact hole according to the prior art.
Figure 2:
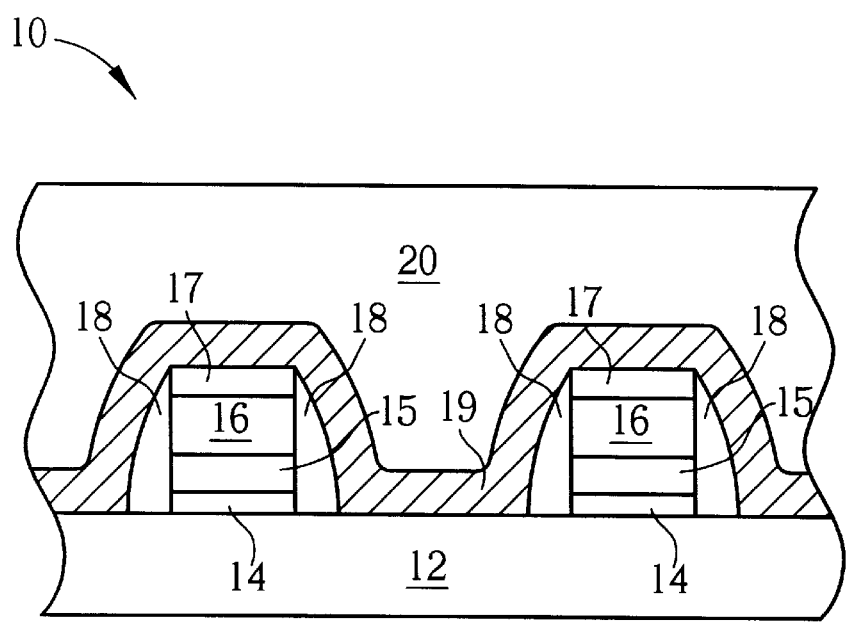
Figure 3:
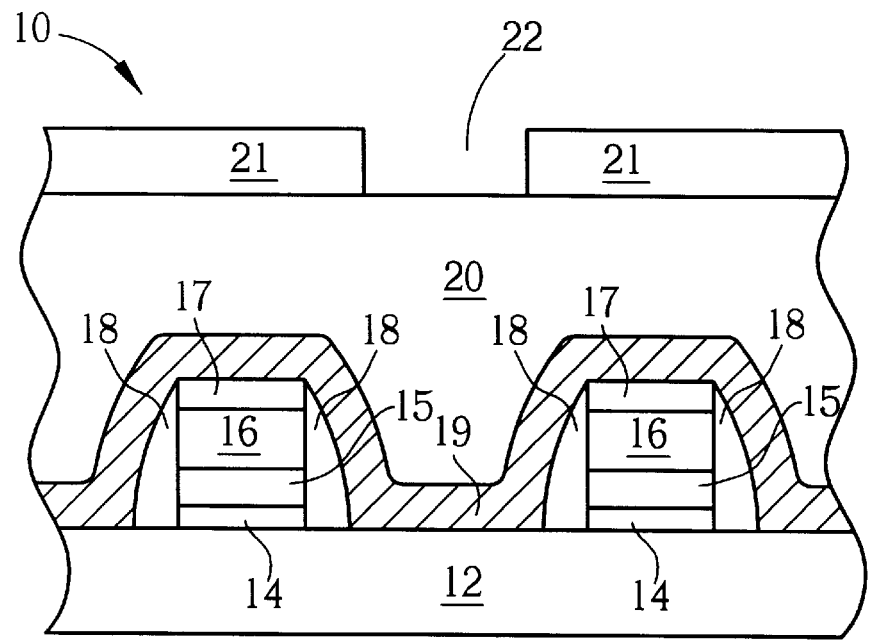
Figure 4:
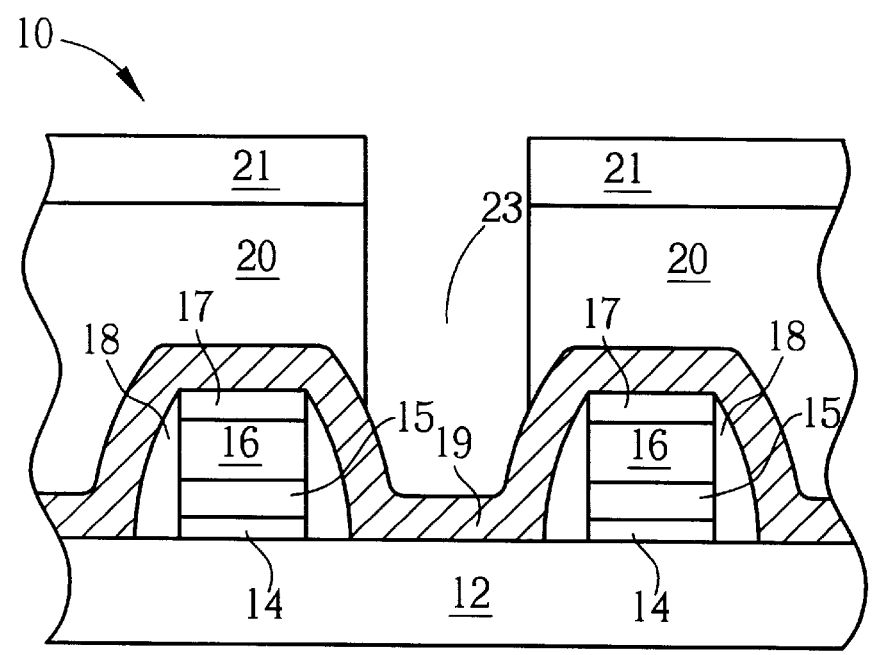
Figure 5:
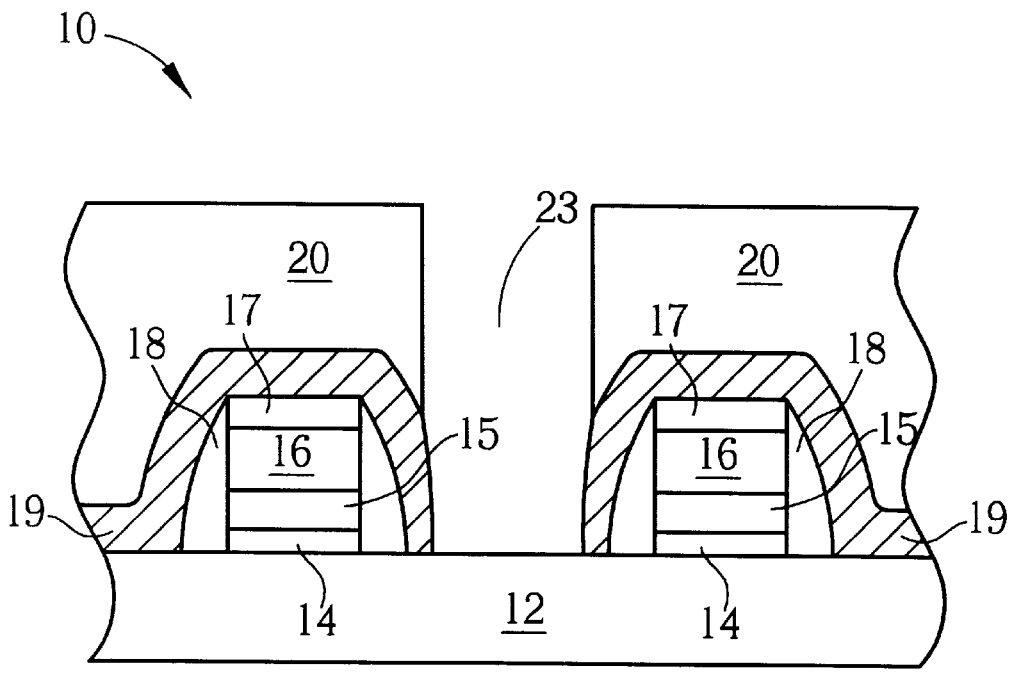
Figure 6:
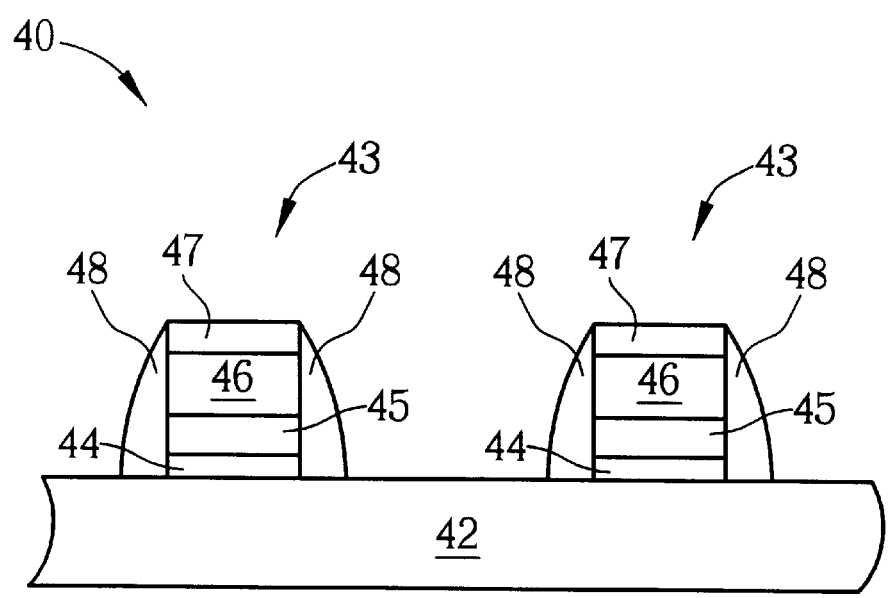
FIG. 6 to FIG. 10 are cross-sectional diagrams of forming a contact hole according to the present invention.

Please refer to FIG. 6 to FIG. 10. FIG. 6 to FIG. 10 are cross-sectional diagrams of forming a contact hole 53 on a semiconductor wafer 40 according to the present invention. The semiconductor wafer 40 comprises a silicon substrate 42, two adjacent gates 43 positioned on the surface of the silicon substrate 42, as shown in FIG. 6. Each of the gates comprises a silicon oxide layer 44 serving as a gate oxide layer and positioned in a predetermined area on the semiconductor wafer, a polysilicon layer 45 positioned on the surface of the silicon oxide layer 44 serving as a conductive layer, and a silicide layer 46 positioned on the surface of the polysilicon layer 45 to reduce the electrical resistance of the conductive layer. Each gate 43 comprises a silicon nitride spacer 48 on each of two opposite walls, and a silicon nitride passivation layer 47 on the top surface of the gate 43.

Figure 7:
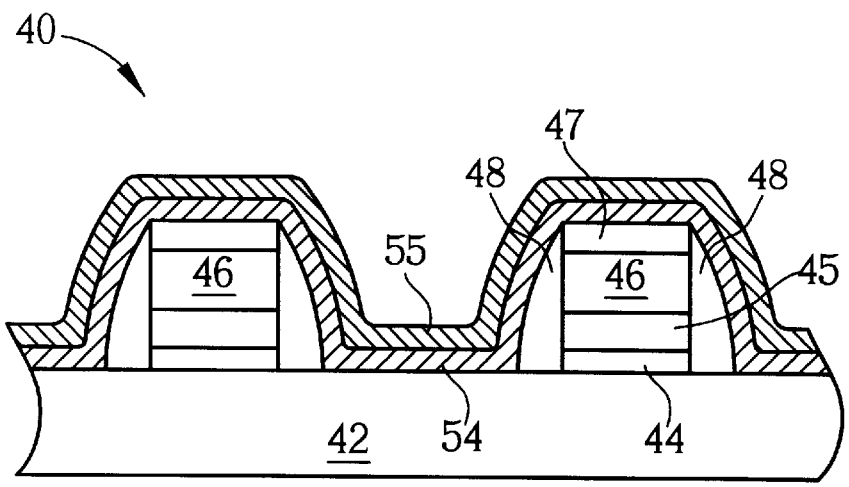

According to the present invention, a PECVD process is performed to form a silicon-oxygen-nitride layer 54 of predetermined thickness on the surface of the gate 43 and the silicon substrate 42, and form a silicon-oxygen-nitride layer 55 of predetermined thickness on the surface of the silicon-oxygen-nitride layer 54, as shown in FIG. 7. During the PECVD process, the injected gas is mixture of silane, nitrous oxide and nitrogen. When the predetermined thickness of the silicon-oxygen-nitride layer 54 is obtained, the ratio of silane in the mixture is increased to deposit the silicon-oxygen-nitride layer 55 and to increase the ratio of silicon in the silicon-oxygen-nitride layer 55.

Figure 8:
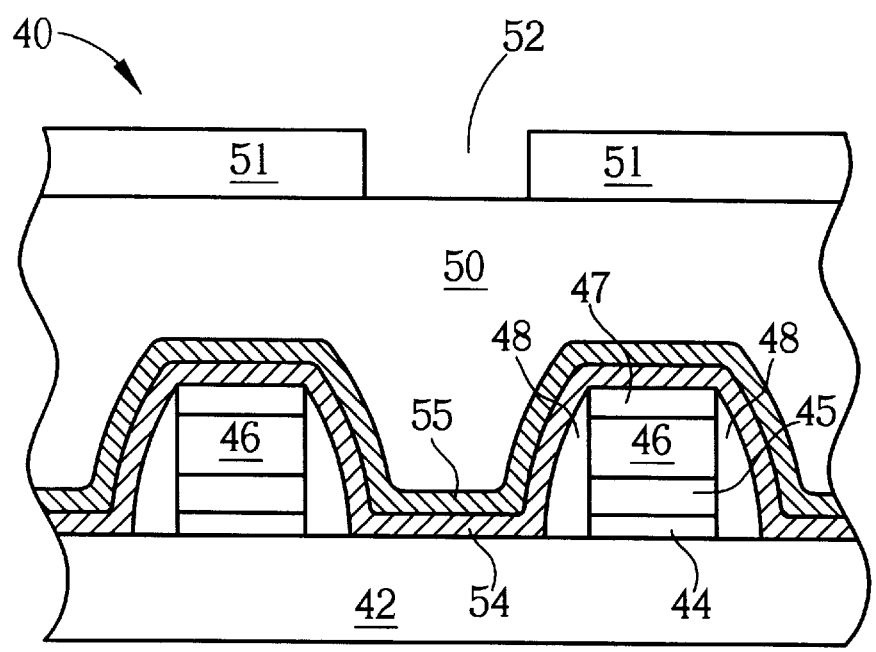
Figure 9:
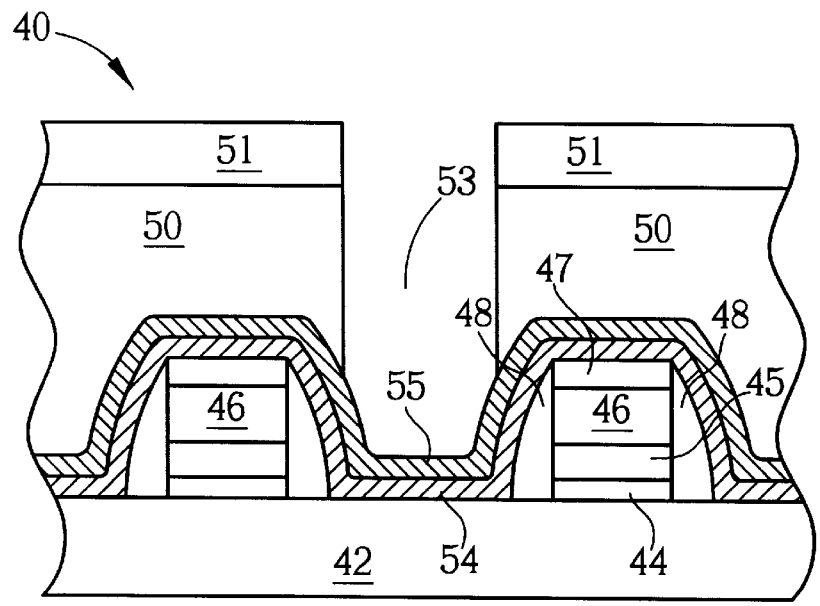
Figure 10:
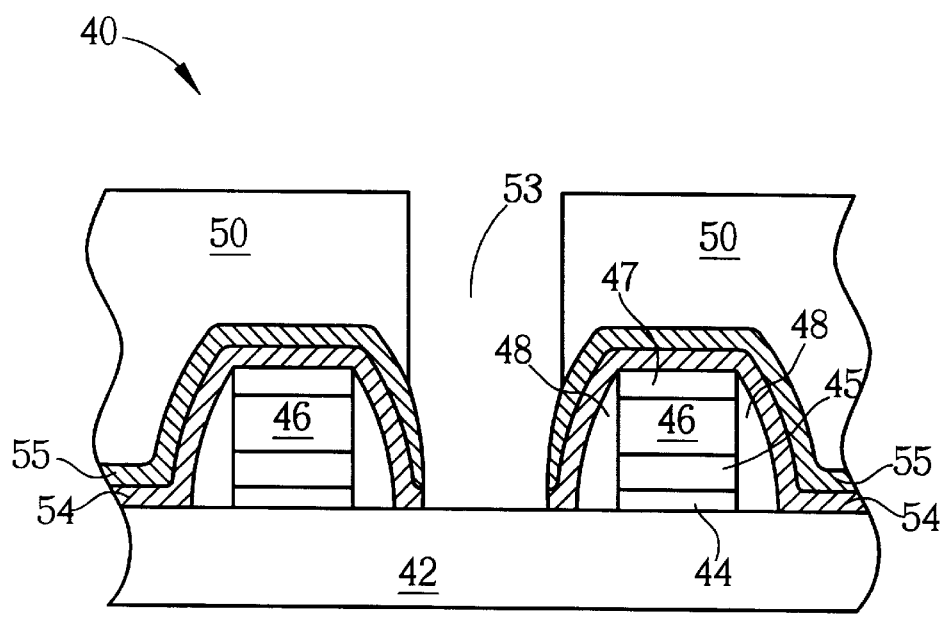

An LPCVD process is next performed to form a BPSG layer 50 on the surface of the silicon-oxygen-nitride layer 55, as shown in FIG. 8. The BPSG layer 50 serves as a dielectric layer. A photoresist layer 51 is then formed on the surface of the BPSG layer 50, and a lithographic and etching process are performed to form an opening 52 for patterning the contact hole 53. A SAC etching process is performed to remove the BPSG layer 50 under the opening 52 down to the surface of the silicon-oxygen-nitride layer 55, as shown in FIG. 9. The silicon-oxygen-nitride layer 54, 55 and the photoresist layer 51 serve as an etching mask. The etching selectivity of the SAC process is then changed to remove the silicon-oxygen-nitride layer 54 and 55 under the opening 52 down to the surface of the substrate 42, and then the photoresist layer 51 is removed to complete the contact hole 53, as shown in FIG. 10.

The combined thickness of the silicon-oxygen-nitride layers 54 and 55 is predetermined, and is about 300 angstroms, comparable to the silicon nitride layer according to the prior art. The thickness of each silicon-oxygen-nitride layer can be controlled according to manufacturing process conditions. The silicon-oxygen-nitride layer 54 is used as a diffusion barrier layer to prevent diffusion of boron and phosphorous from the BPSG layer into the silicon substrate 42 and the gate 43. The silicon-oxygen-nitride layer 55 is used as an etching stop layer for the SAC etching process. The thickness of the silicon-oxygen-nitride layer 54 can be increased for a higher diffusion barrier ability, and the thickness of the silicon-oxygen-nitride layer 55 can be increased to improve the selectivity of the SAC etching process. The silicon-oxygen-nitride layers 54 and 55 together constitute the passivation layer of the DRAM.

Generally speaking, the quantity of silicon in silicon-oxygen-nitride affects the extinction coefficient, the etching selectivity, the tensile stress and the diffusion barrier ability. The diffusion barrier ability is increased, but the extinction coefficient and the tensile stress are reduced as the quantity of silicon in the silicon-oxygen-nitride decreases. The diffusion barrier ability is reduced, but the etching selectivity and the extinction coefficient are increased as the quantity of silicon in the silicon-oxygen-nitride increases.

The present invention controls the quantity of the silicon in the silicon-oxygen-nitride layers 54 and 55 according to manufacturing process conditions. The silicon-oxygen-nitride layer 54 is formed on the surface of the silicon substrate 42 and is used to prevent diffusion of boron and phosphorous from the BPSG layer 50 into the silicon substrate 42 and the gates 43. The tensile stress must be made as low as possible, and the diffusion barrier ability should be made as high as possible. Consequently, the silicon-oxygen-nitride layer 54 contains a lower quantity of silicon and has a lower extinction coefficient of 0.5. The silicon-oxygen-nitride layer 55 serves as an etching stop layer for the SAC etching process, and so the etching selectivity between the silicon-oxygen-nitride layer 55 and the BPSG layer 50 must be made as large as possible. Therefore, the silicon-oxygen-nitride layer 55 contains a higher quantity of silicon and has a higher extinction coefficient of 0.75. The extinction coefficient of the silicon-oxygen-nitride layer 54 is smaller than that of the silicon-oxygen-nitride layer 55, and the extinction coefficient of both layers is between 0.3 and 0.8. The dual layer silicon-oxygen-nitride structure of the present invention replaces the single layer silicon nitride structure to solve the previously mentioned problems of the prior art. The tensile stress between the silicon substrate 42 and silicon-oxygen-nitride layer 54 according the present invention is smaller than that between the silicon substrate and the silicon nitride layer according to the prior art.

The permeability to hydrogen of the silicon-oxygen-nitride layer 54 and 55 is higher than that of the silicon nitride layer according to prior art. Hence, hydrogen can effectively erase the dangling bonds between the oxide layer 44 and the silicon substrate 42 in a hydrogen annealing process. The silicon-oxygen-nitride layers 54 and 55 thus enhance the efficiency of the hydrogen annealing process and ensure the electrical properties of the gate 43. Furthermore, unlike the silicon nitride layer, which is formed by performing an LPCVD process at about 700~800° C., the silicon-oxygen-nitride layer 54 and 55 are formed by performing a PECVD process at a temperature that is below 450° C. Thus, the thermal budget is reduced according to the present invention.

In contrast to the prior art method of forming a passivation layer, the dual layer silicon-oxygen-nitride structure formed by performing the PECVD process according to the present invention replaces the single layer silicon nitride structure formed by performing an LPCVD process of the prior art. The tensile stress between the silicon substrate 42 and silicon-oxygen-nitride layer 54 and 55 according the present invention is smaller than that between the silicon substrate and the silicon nitride layer of the prior art. Therefore, the present invention avoids the formation of cracks in the silicon nitride layer 19 and the consequent faster discharging of the capacitor. The silicon-oxygen-nitride layer 54 and 55 have a higher permeability to hydrogen, therefore the efficiency of the hydrogen annealing process is enhanced and the electrical properties of the gate 43 are ensured. The PECVD process is performed at a lower temperature than the LPCVD process, and so the thermal budget is reduced. In addition, the silicon-oxygen-nitride layers 54 and 55 of the present invention also serve as diffusion barriers against boron and phosphorous of the BPSG layer, and have a high etching selectivity for the SAC etching process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a passivation layer of DRAM (dynamic random access memory) on a semiconductor wafer, the semiconductor wafer comprising a silicon substrate, and two adjacent gates positioned on the surface of the semiconductor water, each gate comprising a silicon oxide layer serving as a gate oxide layer and positioned on the silicon substrate, a polysilicon layer positioned on the surface of the silicon oxide layer serving as a conductive layer, a silicide layer positioned on the surface of the polysilicon layer to reduce the resistance of the conductive layer, and a spacer on each of two opposite walls, the method comprising:

forming a first silicon-oxygen-nitride layer of predetermined thickness on the semiconductor wafer wherein the first silicon-oxygen-nitride layer is used as a diffusion barrier layer;

forming a second silicon-oxygen-nitride layer of predetermined thickness on the first silicon-oxygen-nitride layer wherein the second silicon-oxygen-nitride layer is used as an etching layer;

forming a BPSG (borophosphosilicate glass) layer uniformly on the second silicon-oxygen-nitride to planarize the surface of the semiconductor wafer wherein the BPSG layer is used as a dielectric layer;

wherein the first silicon-oxygen-nitride layer is used to prevent diffusion of boron and phosphorous form the BPSG layer into the silicon substrate, the first and the second silicon-oxygen-nitride layers together constitute the passivation layer of the DRAM.

2. The method of claim 1 wherein the spacers are made of silicon nitride.

3. The method of claim 1 wherein the combined thickness of the first and the second silicon-oxygen-nitride layers is predetermined and the thickness of each layer can be controlled according to manufacturing process conditions.

4. The method of claim 1 wherein the extinction coefficient of the first silicon-oxygen-nitride layer is smaller than that of the second silicon-oxygen-nitride layer, and the extinction coefficient of the first and the second layers is between 0.3 and 0.8.

5. A method a forming passivation layer of a DRAM on a semiconductor wafer, the semiconductor wafer comprising a silicon substrate, and two adjacent gates positioned on the surface of the semiconductor wafer, each gate comprising a silicon oxide layer serving as a gate oxide layer and positioned on the silicon substrate, a polysilicon layer positioned on the surface of the silicon oxide layer serving as a conductive layer, a silicide layer positioned on the surface of the polysilicon layer to reduce the resistance of the conductive layer, and a spacer on each of two opposite walls, the method comprising:

forming a passivation layer of predetermined thickness on the silicon substrate to protect the silicon substrate of the semiconductor wafer;

forming a BPSG (borophosphosilicate glass) layer uniformly on the passivation layer to planarize the surface of the semiconductor wafer;

wherein the BPSG layer is used as a dielectric layer.

6. The method of claim 4 wherein each of the gates comprises a silicon oxide layer serving as a gate oxide layer and positioned in a predetermined area on the semiconductor wafer, a polysilicon layer positioned on the surface of the silicon oxide layer serving as a conductive layer, and a silicide layer positioned on the surface of the polysilicon layer to reduce the resistance of the conductive layer.

7. The method of claim 4 wherein the spacers are made of silicon nitride.

8. The method of claim 5 wherein the combined thickness of the first and the second silicon-oxygen-nitride layers is predetermined and the thickness of each layer can be controlled according to manufacturing process conditions.

* * * * *